(12) United States Patent
Corisis et al.

(10) Patent No.: US 6,329,222 B1
(45) Date of Patent: Dec. 11, 2001

(54) INTERCONNECT FOR PACKAGING SEMICONDUCTOR DICE AND FABRICATING BGA PACKAGES

(75) Inventors: David Corisis; Walter Moden, both of Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/467,643

(22) Filed: Dec. 20, 1999

Related U.S. Application Data

(62) Division of application No. 09/206,116, filed on Dec. 4, 1998, now Pat. No. 6,232,666.

(51) Int. Cl.[7] .......................... H01L 21/44; H01L 21/48; H01L 21/50
(52) U.S. Cl. .......................... 438/118; 438/125; 438/127; 438/458; 438/460
(58) Field of Search .................... 438/106, 118, 438/125, 126, 127, 458, 459, 460, 464

(56) References Cited

U.S. PATENT DOCUMENTS

| | | |
|---|---|---|
| 5,216,278 | 6/1993 | Lin et al. . |
| 5,397,921 | 3/1995 | Karnezos . |
| 5,409,865 | 4/1995 | Karnezos . |
| 5,420,460 | 5/1995 | Massingill . |
| 5,663,593 | 9/1997 | Mostafazadeh et al. . |
| 5,767,575 | 6/1998 | Lan et al. . |
| 5,780,923 | 7/1998 | Courtenay . |
| 5,926,696 | * 7/1999 | Baxter et al. . |
| 6,004,867 | * 12/1999 | Kim et al. . |
| 6,097,087 | 8/2000 | Farnworth et al. . |
| 6,232,666 | 5/2001 | Corisis et al. . |

OTHER PUBLICATIONS

DiStefano, T. H., "Chip Scale Review", May 1997, vol. 1., No. 1, pp. 20–27.

* cited by examiner

Primary Examiner—Kevin M. Picardat
Assistant Examiner—D. M. Collins
(74) Attorney, Agent, or Firm—Stephen A. Gratton

(57) ABSTRACT

An interconnect for BGA packages, a BGA package fabricated using the interconnect, and a method for fabricating BGA packages using the interconnect, are provided. The interconnect includes multiple polymer substrates on which patterns of conductors are formed. Each substrate can be used to fabricate a BGA package. The conductors on the substrates include end portions having bonding vias formed therethrough in alignment with access openings in the substrates. During fabrication of the BGA packages, the bonding vias allow the conductors to be bonded to bond pads on semiconductor dice by forming metal bumps on the bonding vias and bond pads. The access openings in the substrates provide access to the bonding vias and bond pads for a bonding tool configured to form the metal bumps. In addition to the bonding vias, the conductors include ball bonding pads configured for attaching ball contacts, such as solder balls, to the conductors and substrates. The completed BGA package includes a substrate adhesively bonded to a semiconductor die; conductors with bonding vias on the substrate; metal bumps in the bonding vias bonding the conductors to bond pads on the die; and an area array of ball contacts attached to the conductors and substrate.

23 Claims, 5 Drawing Sheets

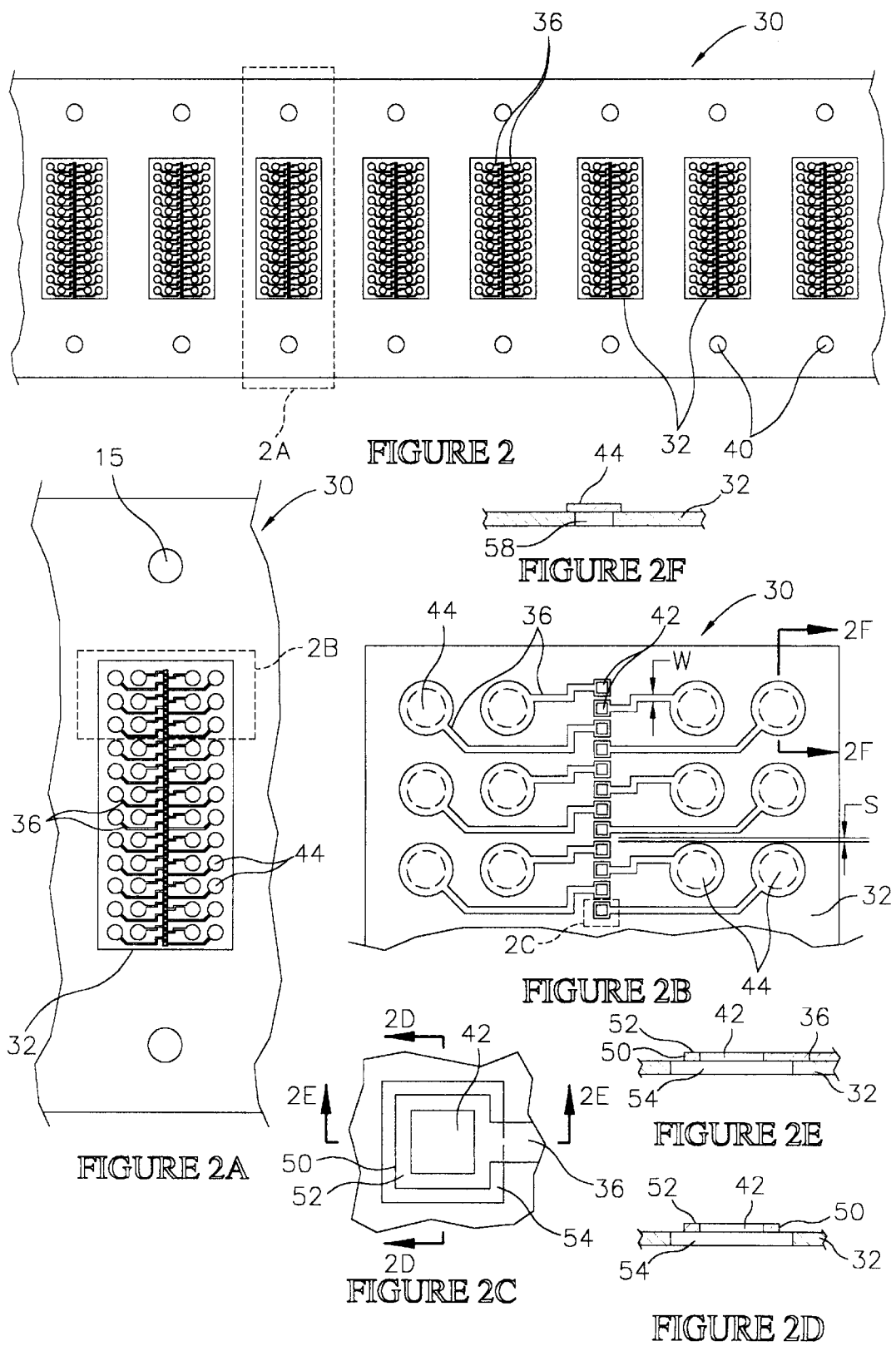

INTERCONNECT FOR PACKAGING SEMICONDUCTOR DICE AND FABRICATING BGA PACKAGES

CROSS REFERENCE TO RELATED APPLICATIONS

This application is a division of application Ser. No. 09/206,116 filed on Dec. 4, 1998, U.S. Pat. No. 6,232,666.

FIELD OF THE INVENTION

This invention relates generally to semiconductor packaging and specifically to an interconnect for packaging semiconductor dice, and to an improved BGA package fabricated using the interconnect.

BACKGROUND OF THE INVENTION

One type of semiconductor package is referred to as a BGA package. BGA packages were developed to provide a higher lead count, and a smaller foot print, than conventional plastic or ceramic semiconductor packages. A BGA package includes an array of external ball contacts, such as solder balls, that permit the package to be surface mounted to a printed circuit board (PCB) or other electronic component. Some BGA packages have a foot print that is about the size of the die contained in the package. These BGA packages are also known as chip scale packages.

As BGA packages are made smaller, and with higher lead counts, the electrical connections between the die and the ball contacts for the package become more difficult to make. The component of the package that makes the electrical connections between the die and package is sometimes referred to as an interconnect.

One type of prior art BGA package uses an interconnect in the form of a multi layered polymer tape, such as TAB tape. The polymer tape can be provided as a "strip" or "coupon" of material for packaging several dice at a time. Typically, the polymer tape comprises a polyimide substrate having patterns of metal conductors formed thereon. In addition, portions of the conductors can comprise beam leads, formed in a configuration which allows the beam leads to be bonded to the bond pads on the die.

FIG. 1 illustrates a prior art BGA package 10. The BGA package 10 includes: a semiconductor die 12; a polymer tape 14 bonded to a face of the die 12; and an encapsulant 16 bonded to the face and sides of the die 12. The BGA package 10 also includes an adhesive layer 18 for bonding the polymer tape 14 to the die 12. In addition, the BGA package 10 includes a dense array of ball contacts 20 formed on the polymer tape 14. A solder mask 15 locates and electrically insulates the ball contacts 20 from one another.

The polymer tape 14 includes a pattern of metal conductors 21 that form separate electrical paths between bond pads 24 on the die 12 and the ball contacts 20. The conductors 36 include ball bonding pads 23 that are bonded to the ball contacts 20, and beam leads 22 that are bonded to the bond pads 24 on the die 12. The beam leads 22 are also encapsulated in the encapsulant 16.

A representative process for forming the BGA package 10 includes the initial step of bonding one or more dice 12 to a strip of the polymer tape 14. The beam leads 22 can then be bonded to the device bond pads 24. Next, the encapsulant 16 can be formed, and the ball contacts 20 bonded to the ball bonding pads 23. The individual BGA packages 10 can then be singulated from the strip of polymer tape 14 and tested.

Typically, a thermosonic bonding process, using gold, or gold plated materials, is employed to bond the beam leads 22 to the bond pads 24. Specialized bonding tools are required to make the bonds between the beam leads 22 and the bond pads 24. In addition, the beam leads 22 are subjected to stresses from the bonding and encapsulation processes, and during subsequent use of the BGA package 10. These stresses can cause the bonds to weaken and the beam leads to separate from the bond pads 24.

Because of these and other deficiencies in conventional BGA packages, improvements in BGA packages, and in methods for fabricating BGA packages, would be welcomed in the art. The present invention is directed to an improved interconnect for constructing BGA packages. The interconnect is constructed to facilitate formation of bonded connections with the die, and to provide improved bonded connections with the die.

SUMMARY OF THE INVENTION

In accordance with the present invention, an improved interconnect for semiconductor dice, an improved BGA package, and an improved method for fabricating BGA packages, are provided.

The interconnect comprises a polymer substrate, and a pattern of conductors formed on the substrate. In the illustrative embodiment the interconnect contains multiple polymer substrates that are subsequently singulated into individual BGA packages. The conductors include end portions having bonding vias for making bonded electrical connections with bond pads on a semiconductor die. A location of the end portions and bonding vias exactly matches a location of the bond pads on the die, permitting alignment for the bonding process. In addition, the end portions and bonding vias overhang corresponding openings in the polymer substrate, permitting access for a bonding tool for performing the bonding process. The conductors also include ball bonding pads, which allow ball contacts to be bonded to the conductors, and attached to the polymer substrate.

For fabricating a BGA package, the polymer substrate can be adhesively bonded to the die with the bonding vias on the conductors, and the openings in the polymer substrate, aligned with the bond pads on the die. Metal bumps can then be formed in the bonding vias to physically and electrically attach the end portions of the conductors to the bond pads on the die. The metal bumps can be formed using a bonding tool of a wire bonding apparatus, or using a solder ball bumper apparatus. Alternately, the metal bumps can comprise solder bumps of a bumped semiconductor die that are reflowed into the bonding vias. Following forming of the metal bumps, ball contacts, such as solder balls, can be bonded to the ball bonding pads on the conductors.

The completed BGA package includes the semiconductor die, the polymer substrate adhesively bonded to the face of the die, and the metal bumps in the bonding vias bonding the conductors on the polymer substrate to the bond pads on the die. The BGA package also includes an array of ball contacts bonded to the ball bonding pads on the conductors. With this construction, the conductors establish electrical communication between the bond pads on the die, and the ball contacts on the polymer substrate. Further, the metal bumps in the bonding vias physically and electrically bond the conductors to the bond pads on the die.

The method for fabricating the BGA package includes the steps of: providing a polymer substrate comprising a pattern of conductors and a pattern of openings to the conductors; providing the conductors with bonding vias on first end portions thereof aligned with the openings in the polymer substrate; providing the conductors with ball bonding pads on second end portions thereof; adhesively bonding the polymer substrate to a semiconductor die with the bonding vias on the conductors aligned with bond pads on the die; forming metal bumps through the openings in the polymer substrate onto the bonding vias on the conductors to physically and electrically attach the conductors to the bond pads; and then bonding ball contacts to the ball bonding pads on the conductors.

BRIEF DESCRIPTION OF THE DRAWINGS

FIG. 2 is a plan view of an interconnect constructed in accordance with the invention;

FIG. 2A is an enlarged portion of FIG. 2 taken along section line 2A of FIG. 2;

FIG. 2B is an enlarged portion of FIG. 2A taken along section line 2B of FIG. 2A;

FIG. 2C is an enlarged portion of FIG. 2B taken along section line 2C of FIG. 2B;

FIG. 2D is a cross sectional view taken along section line 2D—2D of FIG. 2C;

FIG. 2E is a cross sectional view taken along section line 2E—2E of FIG. 2C;

FIG. 2F is a cross sectional view taken along section line 2F—2F of FIG. 2B;

DETAILED DESCRIPTION OF THE PREFERRED EMBODIMENT

Figure 5A:
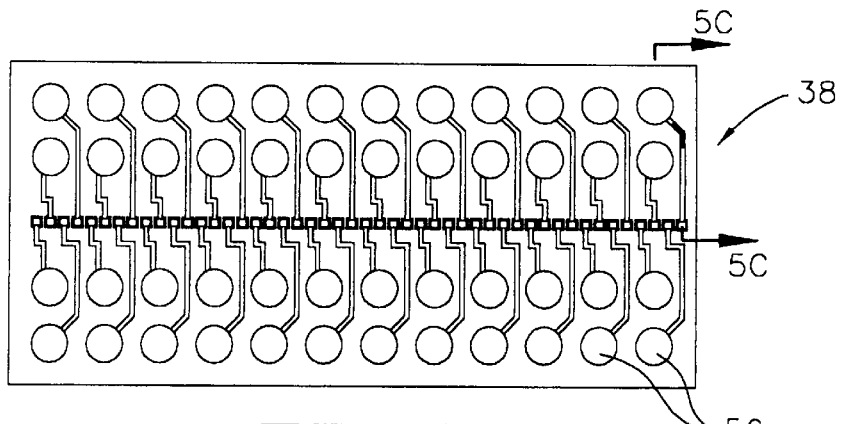
FIG. 5A is a bottom view of a BGA package constructed in accordance with the invention.

Referring to FIGS. 2–2F, an interconnect 30 constructed in accordance with the invention, includes a plurality of polymer substrates 32, and a plurality of patterns of conductors 36 formed on the substrates 32. As will be further explained, the polymer substrates 32 and patterns of conductors 36, can be used to fabricate multiple BGA packages 38 (FIG. 5A). The polymer substrates 32 comprise segments of the interconnect 30 that will subsequently be singulated into separate BGA packages 38 (FIG. 5A).

In the illustrative embodiment, the interconnect 30 comprises a strip of material similar in size and shape to a conventional semiconductor lead frame. The polymer substrates 32 correspond to die mounting paddles on a conventional lead frame. Alternately, the interconnect 30 can be shaped as a coupon of material, with the outline and location of the polymer substrates 32 corresponding to the outline and location of semiconductor dice contained on a semiconductor wafer. The coupon can be shaped to package a desired number of dice on the wafer, up to all of the dice on the wafer.

Suitable materials for the interconnect 30 and polymer substrates 32 include polyimide, polyester, epoxy, urethane, polystyrene, silicone and polycarbonate. A representative thickness for the interconnect 30 and polymer substrates 32 can be from about 25 to 400 μm.

As shown in FIG. 2, the interconnect 30 includes a plurality of indexing openings 40 formed therethrough proximate to longitudinal edges thereof. The indexing openings 40 permit the interconnect 30 to be handled by automated transfer mechanisms associated with various apparatuses that will be used during fabrication of the BGA packages 38 (FIG. 5A), such as chip bonders and ball bonders.

The patterns of conductors 36 can be formed on the substrates 32 using a subtractive process. For example, the conductors 36 can comprise a metal foil, bonded to the polymer substrates 32, then photo patterned, and etched. Alternately, a metal layer can be blanket deposited on the polymer substrates 32, such as by electrodeposition, then photo patterned, and etched to form the conductors 36. Using a subtractive process a width "w" and spacing "s" of the conductors can be as small as about 0.075 mm. As another alternative, the patterns of conductors 36 can be formed using an additive process by deposition, or printing, of a metal through a mask. Using an additive process a width "w" and spacing "s" of the conductors can be as small as about 0.030 mm.

Preferably, the conductors 36 comprise a highly conductive metal, such as copper, plated copper, gold, gold plated metals, nickel, or an alloy such as Ni—Pd. By way of example, the conductors 36 can be formed with a thickness of from 1 μm to 35 μm.

As shown in FIG. 2B, each conductor 36 includes a bonding via 42 formed on a first end thereof. The bonding vias 42 are configured to make electrical connections with bond pads 46 (FIG. 5D) formed on a face of a semiconductor die 34 (FIG. 5D). In addition, each conductor 36 includes a ball bonding pad 44 on a second end thereof. The ball bonding pads 44 are configured for bonding ball contacts 56 (FIG. 5A) to the polymer substrates 32.

As shown in FIG. 2C, the bonding vias 42 comprise through openings in the conductors 36. In the illustrative embodiment, the conductors 36 include enlarged end portions 50 wherein the bonding vias 42 are formed. However, it is to be understood that the invention can be practiced by forming the bonding vias 42 in conductors having end portions with the same width as the remainder of the conductors. Also, in the illustrative embodiment, the end portions 50 and bonding vias 42 both have a generally square shaped peripheral configuration. However, other geometrical configurations such as circular, triangular and oval can be employed for the bonding vias 42.

A peripheral size of each end portion 50 is about the same as the peripheral size of a bond pad 46 (FIG. 5D) on the die 34 (FIG. 5A). By way of example, the end portions 50 can be from about 0.05 mm (50 μm) to 0.20 mm (200 μm) on a side and spaced by about the same amount. The bonding vias 42 are sized to fit within the end portions 50. Accordingly, a continuous square metal segment 52 encloses and defines the periphery of each bonding via 42. In addition, a continuous electrical path is provided through the conductors 36 to the square metal segments 52.

A location and spacing of the end portions 50 and bonding vias 42, exactly matches a location and spacing, of the bond pads 46 (FIG. 5D) on the die 34 (FIG. 5D). In the illustrative embodiment, the bond pads 46 (FIG. 5D) are formed in a single row along a center line of the die 34, in the manner of a leads over chip die. Alternately, the location and pattern of the end portions 50, and bonding vias 42, can match other bond pad configurations, such as along the ends, or edges, of the die 34.

As shown in FIGS. 2C, 2D and 2E, the polymer substrates 32 include patterns of access openings 54 that correspond to the locations of the end portions 50 and bonding vias 42. As will be further explained, the access openings 54 permit access for a bonding tool to form metal bumps 60 (FIG. 5D) in the bonding vias 42 (FIG. 2D), for bonding the end portions 50 of the conductors 36 to the bond pads 46 (FIG. 5D) on the die 34 (FIG. 5D). The access openings 54 in the polymer substrates 32 have peripheral outlines that are larger than the peripheral outlines of the end portions 50 of the conductors 36 on the polymer substrates 32. The end portions 50 thus overhang the access openings 54 in a manner that is similar to beam leads on TAB tape. The access openings 54 can be formed by laser machining, punching or etching the polymer substrates 32. In addition, the access openings 54 can be formed either prior to, or after, formation of the conductors 36 on the polymer substrates 32.

Referring to FIG. 2F, a single ball bonding pad 44 of a conductor 36 on the polymer substrate 32 is illustrated in cross section. The ball bonding pads 44 can be formed of a same metal as the conductors 36, preferably at the same time as the conductors 36 are formed on the polymer substrate 32. The ball bonding pads 44 can also be plated with a metal, such as Ni or Au, to facilitate a subsequent solder reflow process wherein the ball contacts 56 (FIG. 5A) will be bonded to the ball bonding pads 44. Depending on the size and the pitch of the ball contacts 56 (FIG. 5A) in the grid array for the package 38 (FIG. 5B), a representative diameter of the ball bonding pads 44 can be from about 0.22 mm to 1.0 mm.

As also shown in FIG. 2F, the polymer substrate 32 includes a pattern of ball openings 58 in alignment with the ball bonding pads 44. The ball openings 58 provide access through the polymer substrate 32 for bonding the ball contacts 56 to the ball bonding pads 44. The ball openings 58 can be formed at the same time as the access openings 54 by laser machining, punching or etching the substrates 32. Preferably the ball openings 58 have a peripheral outline that is about the same as the ball bonding pads 44.

Referring to FIGS. 3A–3D, steps in a method for fabricating a plurality of semiconductor packages 38 (FIG. 5A) using the interconnect 30. In FIGS. 3A–3D, a segment of one substrate 32 on the interconnect 30 is illustrated schematically.

Figure 1:
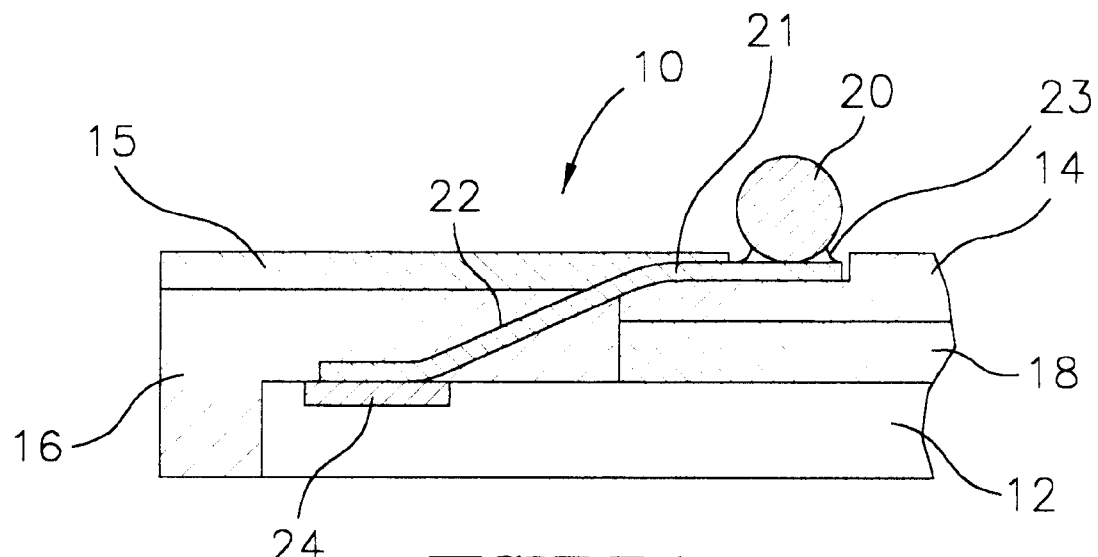
FIG. 1 is an enlarged schematic cross sectional view of a prior art BGA package.
Figure 3A:
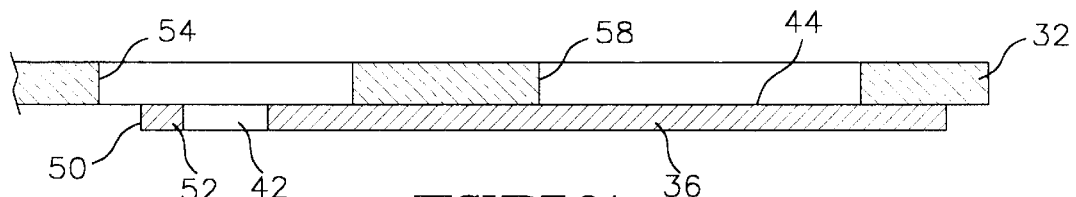
FIGS. 3A–3D are schematic cross sectional views illustrating steps in a method for fabricating a BGA package in accordance with the invention.

Initially, as shown in FIG. 3A, the interconnect 30 can be provided substantially as previously described, and shown in FIGS. 2–2F. The substrate 32 on the interconnect 30 includes access openings 54 and ball openings 58. In addition, patterns of conductors 36 are attached to the substrate 32. The conductors 36 include end portions 50 aligned with the access openings 54 through the substrate 32. The end portions 50 include bonding vias 42 formed and sized as previously described. The conductors 36 also include ball bonding pads 44 aligned with the ball openings 58 through the polymer substrate 32.

Figure 3B:
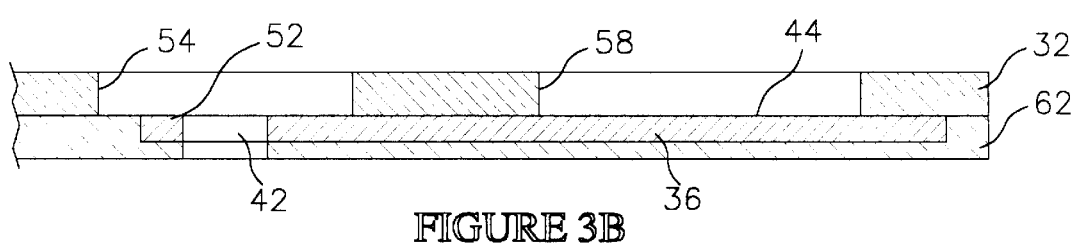

Next, as shown in FIG. 3B, for attaching the polymer substrate 32 to the die 34 (FIG. 3C), an adhesive layer 62 can be formed between the die 34 and the polymer substrate 32. In FIG. 3B, the adhesive layer 62 is initially shown as being formed on the polymer substrate 32. However, the adhesive layer 62 can also be initially formed on the die 34. The adhesive layer 62 can comprise a die attach adhesive such a silicone, epoxy, polyimide or acrylic material. The adhesive layer 62 is applied such that the bonding vias 42 on the conductors 36 are unobstructed by adhesive material.

Figure 3C:
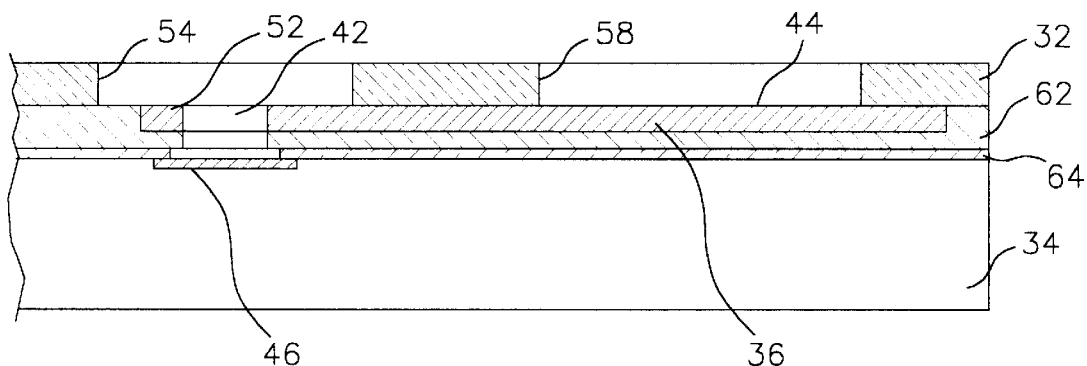

Next, as shown in FIG. 3C, the polymer substrate 32 and the die 34 are adhesively bonded using the adhesive layer 62. For some adhesive materials, a curing step can also be performed using localized heating, or heating in an oven. In FIG. 3C, the bond pads 46 are embedded in a die passivation layer 64, which is placed in physical contact with the adhesive layer 62. Prior to bonding the die 34 to the polymer substrate 32, the bond pads 46 on the die 34 are aligned with the bonding vias 42 on the polymer substrate 32. Alignment can be accomplished using a split optics system such as one used in an aligner bonder tool, or using an alignment fence or jig.

Figure 3D:
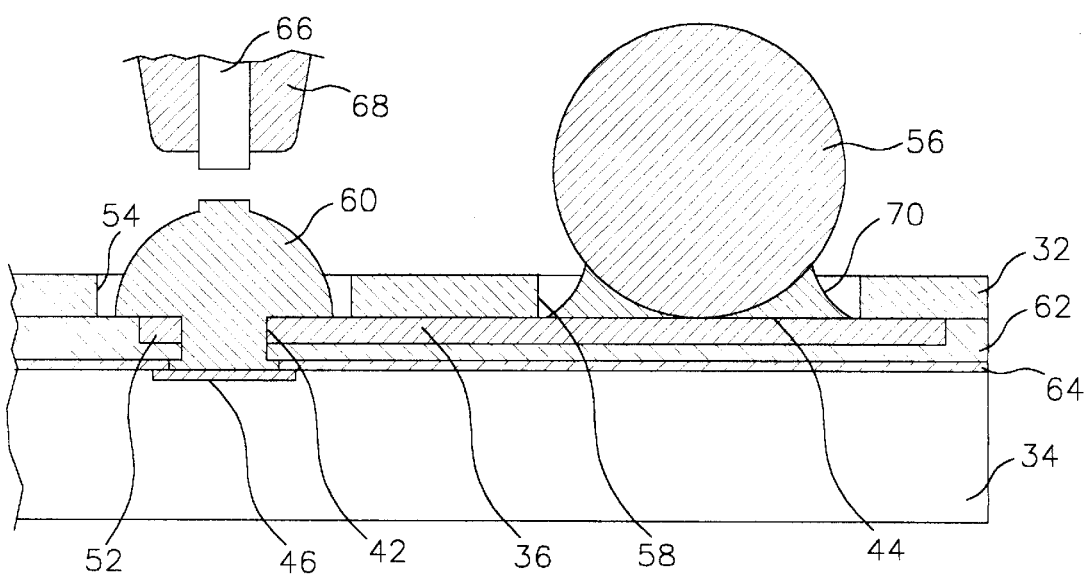

Next, as shown in FIG. 3D, the metal bumps 60 are formed in the bonding vias 42 bonding the end portions 50 of the conductors 36 to the bond pads 46 on the die 34. The access openings 54 provide access through the substrate 32 for forming the metal bumps 60. The metal bumps 60 can be formed using a conventional wire bonding tool 68 configured for thermocompression bonding (T/C), thermosonic bonding (T/S), or wedge bonding (W/B) of a metal wire 66. Suitable materials for forming the metal bumps 60 include gold, palladium, silver and solder alloys.

The metal bumps 60 can also be constructed using a solder ball bumper apparatus rather than a wire bonding tool. A solder ball bumper apparatus attaches pre-formed solder balls to metal pads, such as bond pads on a die or land pads on a substrate, using a reflow process. A representative solder ball bumper apparatus with a laser reflow system is manufactured by Pac Tech Packaging Technologies of Falkensee, Germany. If a solder ball bumper is employed to form the metal bumps 60, the bonds pads 46 can include one or more outer layers to provide a diffusion barrier (not shown). For aluminum bond pads 46 suitable diffusion barrier metals include Ni-Au and Pd. Such a diffusion barrier could be used to prevent diffusion between the metal bumps 60 and the bond pads 46, and to improve the reliability and electrical performance of the metal bumps 60.

As also shown in FIG. 3D, following formation of the metal bumps 60, the ball contacts 56 can be bonded to the ball bonding pads 44 on the conductors 36. Preferably the ball contacts 56 comprise solder balls formed of a suitable solder alloy (e.g., 95%Pb/5%Sn, 60%Pb/40%Sn, 63%In/37%Sn, or 62%Pb/36%Sn/2%Ag).

A solder reflow process can be used to bond the ball contacts 56 to the ball bonding pads 44. Prior to the solder reflow process, solder flux can be deposited on the ball bonding pads 44 and on the ball contacts 56. The ball contacts 56 can then be placed on the ball bonding pads 44, and a furnace used to form metallurgical solder joints 70 between the ball contacts 56 and the ball bonding pads 44. During bonding of the ball contacts 56, the ball openings 58 in the polymer substrate 32 facilitate alignment of the ball contacts 56 to the ball bonding pads 44. In addition, in the completed BGA package 38, the polymer substrate 32 insulates adjacent ball contacts 56 and insulates the conductors 36 from the ball contacts 56.

Following bonding of the ball contacts 56, the interconnect 30 can be singulated into a plurality of separate packages 38 by punching, shearing or cutting the polymer substrates 32 from the interconnect 30. If a wafer level fabrication process is employed, singulation can be accomplished by separating the dice 34 and packages 38 from the wafer using a diamond tipped saw.

Figure 4A:
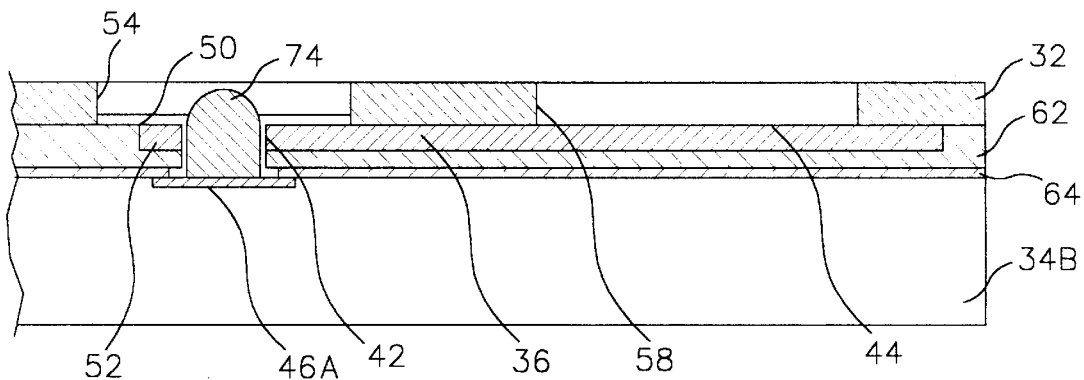
FIGS. 4A–4C are schematic cross sectional views illustrating steps in an alternate embodiment method for fabricating a BGA package in accordance with the invention.
Figure 4B:
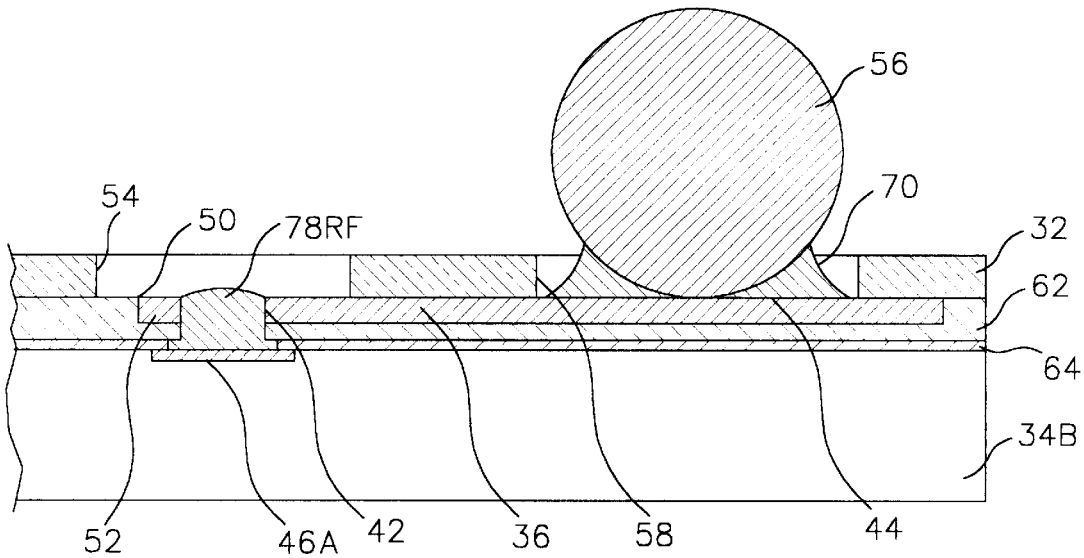
Figure 4C:
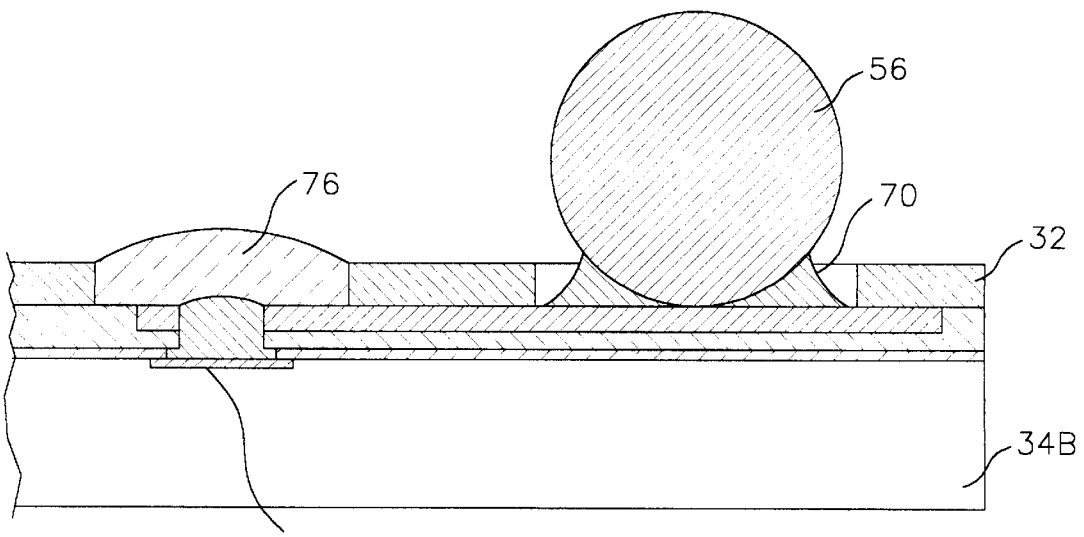

Referring to FIGS. 4A–4C, an alternate embodiment process for fabricating semiconductor packages using the interconnect 30 is illustrated. Initially as shown in FIG. 4A, the polymer substrate 32 is provided substantially as previously described. In addition, a bumped die 34B is provided. The bumped die 34B includes solder bumps 74 formed on bond pads 46A of the die 34B. During adhesive bonding of the bumped die 34B to the polymer substrate 32, the solder bumps 74 are aligned and placed through the bonding vias 42 on the conductors 36.

Next, as shown in FIG. 4B the solder bumps 74 are reflowed to form reflowed solder bumps 78RF. The reflowed solder bumps 78RF fill the bonding vias 42 and physically and electrically bond the end portions 50 of the conductors 36 to the bond pads 46A. The reflow process can be performed using localized heating with a thermode or by global heating in an oven. Following the reflow process the ball contacts 56 can be bonded to the ball bonding pads 44 substantially as previously described.

Next, as shown in FIG. 4C, an encapsulant 76 can be formed on the reflowed solder bumps 78RF for protecting and electrically insulating the reflowed solder bumps 78RF. The encapsulant 76 can comprise an epoxy, silicone, polyimide or room temperature vulcanizing material applied through a nozzle as a glob top.

The encapsulant 76 can also be in the form of a solder mask, such as a blanket deposited photoimageable resist blanket, which can be exposed through a mask, then developed in a required pattern and with required features (e.g., openings). One suitable resist is commercially available from Taiyo America, Inc., Carson City, Nev. under the trademark "PSR-4000". The "PSR-4000" resist can be mixed with an epoxy such as epoxy "720" manufactured by Ciba-Geigy (e.g., 80% PSR-4000 and 20% epoxy "720"). Another suitable resist is commercially available from Shipley under the trademark "XP-9500". Although not shown, an encapsulate can also be formed over the metal bump 60 of the previous embodiment.

Figure 5B:
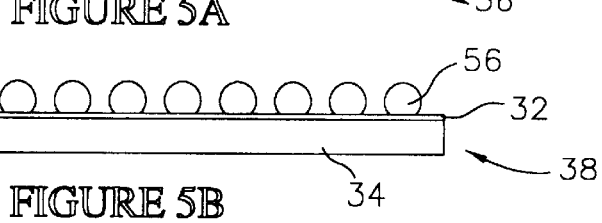
FIG. 5B is a side elevation view of the package of FIG. 5A.
Figure 5C:
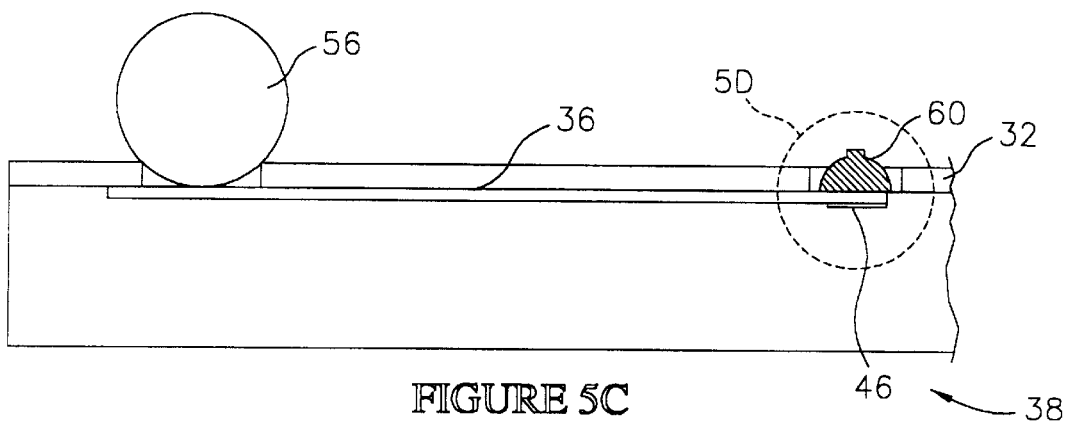
FIG. 5C is an enlarged cross sectional view taken along section line 5C—5C of FIG. 5B.
Figure 5D:
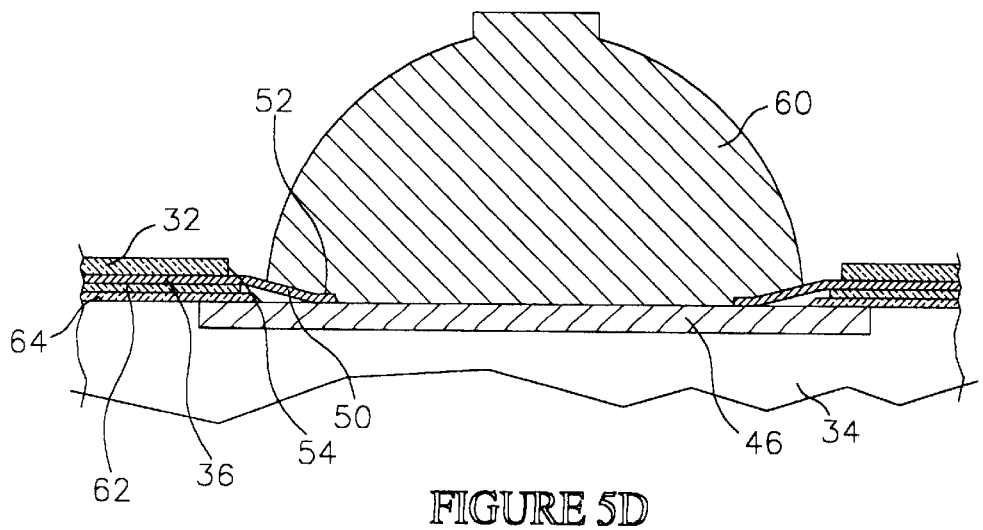
FIG. 5D is an enlarged portion of FIG. 5C taken along section line 5D—5D of FIG. 5C.

Referring to FIGS. 5A–5C, the completed BGA package 38 is illustrated. The BGA package 38 includes the semiconductor die 34 and the polymer substrate 32 adhesively bonded to the die 34. The die 34 includes the bond pads 46 (FIG. 5D) in electrical communication with integrated circuits contained on the die 34. The BGA package 38 also includes the ball contacts 56 bonded to the polymer substrate 32. The ball contacts 56 are arranged in a dense array such that the BGA package 38 can be surface mounted to a mating component such as a printed circuit board.

As shown in FIG. 5C, the conductors 36 on the polymer substrate 32 provide electrical paths from the bond pads 46 on the die 34 to the ball contacts 56 on the polymer substrate 32. In addition, as shown in FIG. 5D, the metal bumps 60 bond the end portions 50 of the conductors 36 to the bond pads 46 on the die 34.

Thus the invention provides an improved interconnect and an improved BGA package. Also provided is an improved method for fabricating BGA packages using the interconnect. Although the invention has been describe with reference to certain preferred embodiments, as will be apparent to those skilled in the art, certain changes and modifications can be made without departing from the scope of the invention, as defined by the following claims.

We claim:

1. A method for fabricating a semiconductor package comprising:

providing a semiconductor die comprising a face and a plurality of pads on the face;

providing a polymer substrate comprising at least one opening configured for alignment with the pads, and a plurality of conductors having portions with bonding vias therethrough aligned with and overhanging the opening;

adhesively bonding the substrate to the face of the die with the opening in the substrate and the bonding vias in the conductors aligned with the pads on the die; and forming metal bumps in the bonding vias, on the portions of the conductors, and on the pads, to physically bond and electrically connect the conductors and the pads, with the opening in the substrate providing access for forming the metal bumps.

2. The method of claim 1 further comprising forming a plurality of external contacts on the conductors.

3. The method of claim 1 wherein the substrate includes a plurality of second openings configured to provide access to the conductors for bonding a plurality of external contacts to the conductors.

4. The method of claim 1 wherein the forming the metal bumps step comprises placing a wire bonding tool through the opening in the substrate.

5. The method of claim 1 wherein the forming the metal bumps step comprises bonding solder balls in the bonding vias, on the portions of the conductors and on the pads on the die using a solder reflow process.

6. The method of claim 1 wherein the forming the metal bumps step comprises bonding solder balls in the bonding vias, on the portions of the conductors and on the pads on the die using a ball bumper apparatus.

7. A method for fabricating a BGA semiconductor package comprising:

providing a semiconductor die comprising a face and a plurality of pads on the face;

providing a polymer substrate comprising a plurality of first openings configured for alignment with the pads on the die, a plurality of second openings in a grid array, and a plurality of conductors having bonding pads and portions aligned with the first openings having bonding vias therethough;

bonding the substrate to the face of the die with the bonding vias in the portions of the conductors and the first openings in the substrate aligned with the pads on the die;

forming metal bumps in the bonding vias, on the portions, and on the pads, to physically bond and electrically connect the conductors to the pads, with the first openings in the substrate providing access for forming the metal bumps; and forming external contacts on the bonding pads with the second openings providing access for forming the external contacts.

8. The method of claim 7 wherein the bonding step comprises forming an adhesive layer between the face of the die and the substrate.

9. The method of claim 8 wherein the forming the metal bump step is performed by reflow bonding solder balls.

10. The method of claim 8 wherein the metal bumps comprise a metal selected from the group consisting of gold, palladium, silver and solder alloys.

11. A method for fabricating a BGA semiconductor package comprising:

providing a semiconductor die comprising a face and a plurality of metal bumps on the face;

providing a polymer substrate comprising at least one opening configured for alignment with the metal bumps on the die, and a plurality of conductors having portions overhanging the opening and including bonding vias therethrough;

adhesively bonding the substrate to the face of the die with the bonding vias in the portions of the conductors and the opening in the substrate aligned with the metal bumps on the die; and reflowing the metal bumps into the bonding vias and onto the portions of the conductors to physically bond and electrically connect the conductors to the die.

12. The method of claim 11 further comprising forming an encapsulant in the opening in the substrate.

13. The method of claim 11 further comprising providing the conductors with bonding pads and bonding the external contacts to the bonding pads.

14. A method for fabricating a semiconductor package comprising:

providing a semiconductor die comprising a face and a plurality of pads on the face;

providing a polymer substrate having at least one opening therethrough configured for alignment with the pads on the die and a plurality of ball bonding openings in a grid array;

providing a plurality of conductors on the substrate having end portions with bonding vias therethrough aligned with and overhanging the opening in the substrate;

providing a plurality of bonding pads on the conductors;

adhesively bonding the polymer substrate to the face of the die with the bonding vias on the end portions of the conductors aligned with the pads on the die;

forming metal bumps in the bonding vias, on the end portions, and on the pads to physically bond and electrically connect the conductors to the pads with the opening in the substrate providing access for forming the metal bumps; and then bonding a plurality of external contacts through the ball bonding openings in the substrate to the conductors.

15. The method of claim 14 wherein the end portions of the conductors have a first peripheral size corresponding to a second peripheral size of the pads on the die.

16. The method of claim 14 wherein the forming the metal bumps step is performed by placing a bonding tool through the opening in the substrate.

17. The method of claim 14 wherein the forming the metal bumps step comprises providing a wire bonding tool, placing the wire bonding tool through the opening in the substrate and then using the wire bonding tool to bond the metal bumps to the pads on the die and to the end portions of the conductors.

18. The method of claim 14 wherein forming the metal bumps step comprises providing a solder ball bumper tool and placing the tool through the opening in the substrate.

19. The method of claim 14 wherein the external contacts comprise balls in a ball grid array.

20. The method of claim 14 further comprising providing the pads on the die with diffusion barriers configured to prevent diffusion of the metal bumps into the pads.

21. The method of claim 14 wherein the providing the polymer substrate step comprises providing a plurality of substrates on a strip of material.

22. The method of claim 14 the first portions of the conductors and the bonding vias in the end portions have a generally square peripheral shape.

23. The method of claim 14 wherein the pads on the die are provided in a single row along a center line of the die.

* * * * *